Aug. 25, 1959 R. E. CUNNINGHAM ET AL 2,901,561
HIGH FREQUENCY AMPLIFIER CIRCUIT
Filed Jan. 23, 1956
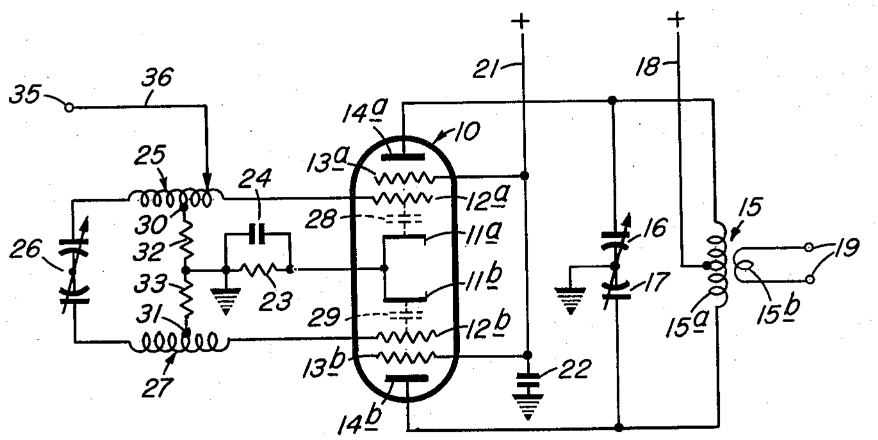
H. R. Sigler, Jr.
R. E. Cunningham
INVENTORS
BY [signature]
ATTORNEY United States Patent Office 2,901,561

Patented Aug. 25, 1959

2,901,561

HIGH FREQUENCY AMPLIFIER CIRCUIT

Robert E. Cunningham, Canoga Park, and Harvey R. Sigler, Jr., Burbank, Calif., assignors to Bendix Aviation Corporation, North Hollywood, Calif., a corporation of Delaware Application January 23, 1956, Serial No. 560,753

1 Claim. (Cl. 179—171)

This invention relates to high frequency electronic push-pull amplifier circuits and is particularly useful in the range of frequencies between 30 and 300 megacycles per second, commonly known as the very high frequency range. In this range of frequencies, the inherent capacities between the input electrodes of suitable amplifying devices, such as electronic tubes, offer a relatively low impedance and reduce the effectiveness of conventional input or driving circuits that may be quite satisfactory at lower frequencies.

A general object of the invention is to provide an improved input circuit for a very high frequency push-pull amplifier.

A more specific object is to provide a series-resonant, push-pull input circuit in which the inductance of the input leads and the capacity between the input electrodes are fully included in and form a part of the series-resonant circuit.

Another object is to increase the tuning range of the input circuit of a very high frequency push-pull amplifier.

A feature of the invention is a tuned push-pull input circuit having separate D.C. return paths for the input electrodes of the two amplifiers, each connected to the closed resonant circuit at a low impedance point therein to diminish loading of the resonant circuit by the return paths.

Other more specific objects and features of the invention will become apparent from the description to follow.

The single figures of the drawing is a schematic diagram of a circuit incorporating the invention.

The drawing shows a push-pull circuit employing two vacuum tube amplifying devices, herein shown as a dual tetrode 10 having two cathodes 11*a* and 11*b*, two control grids 12*a* and 12*b*, two screen grids 13*a* and 13*b*, and two anodes 14*a* and 14*b*.

A tuned output circuit is connected to the anodes 14*a* and 14*b* and comprises a parallel resonant circuit consisting of the primary winding 15*a* of a transformer 15 shunted by two condensers 16 and 17 connected in series with each other and with the transformer winding 15*a*. The junction between the two condensers 16 and 17 is connected to ground, and both condensers may be controlled in unison to vary the tuning without affecting the symmetry to ground. Anode potential is supplied from a positive source over a lead 18 connected to a mid tap on the transformer winding 15*a*. The screen grids 13*a* and 13*b* are energized from a positive source over a conductor 21 and are bypassed to ground through a condenser 22. The secondary winding 15*b* of the transformer 15 is connected to output terminals 19 and is so proportioned relative to the primary winding 15*a* as to provide a desired output impedance.

The entire output circuit, as described, is quite conventional and is merely representative of one type of circuit that may be employed. The present invention resides in the input circuit of the amplifier and will now be described.

The control electrode 12*a* and the cathode 11*a* constitute the input electrodes of one-half of the push-pull tube 10, and the control electrode 12*b* and cathode 11*b* constitute the input electrodes of the other half of the tube. The cathodes 11*a* and 11*b* may also be referred to as "common electrodes," since they are common to both the input and the output circuit. Both cathodes are connected together and to ground through a biasing resistor 23 shunted by a capacitor 24.

The input electrodes 12*a* and 12*b* are connected to each other by a series circuit including a first inductance element 25, a variable capacitor 26, and a second inductance element 27.

Inherent and unavoidable capacity exists between the cathode 11*a* and the input electrode 12*a*, and between the cathode 11*b* and the input electrode 12*b*. These capacities are indicated in dotted lines at 28 and 29, respectively.

These inherent capacities 28 and 29 define with the other circuit elements a closed, tuned series path which may be traced from the cathode 11*a* through the capacity 28, the inductance element 25, the condenser 26, the inductance element 27, the grid 12*b*, the capacity 29, and the cathode 11*b*, which is connected directly to the cathode 11*a*. The values of the inductance elements 25 and 27 and the capacitor 26 are so chosen or adjusted with reference to the inherent capacities 28 and 29 that the closed loop, as traced, is tuned to resonance at the operating frequency. If this circuit is excited at any point, oscillations will be set up in the circuit that will, at any instant, produce opposite potentials on the input electrodes 12*a* and 12*b*, respectively, to properly energize those electrodes in phase opposition.

Looked at in a slightly different way, the inherent capacity 28 has at the operating frequency a negative reactance equaling the positive reactance of a portion only of the inductance 25, and the inductance element 27 has one end portion the inductance of which is such as to have a positive reactance equal to the negative reactance of the capacity 29 at the operating frequency. The sum of the remaining reactances of the inductance elements 25 and 27 is equal and opposite to the reactance of the tuning capacitor 26.

Taps 30 and 31 may be provided on the inductance elements 25 and 27, respectively, at the points thereon marking the ends of those portions of the elements that match the reactances of the capacities 28 and 29, respectively, and grid return resistors 32 and 33 are connected between these taps 30 and 31 and ground. Since the portion of the inductance element 25 between the tap 30 and the cathode 11*a* is a series resonant circuit at the operating frequency, there is a minimum potential drop thereacross, and the tap 30 is at a low potential to ground at the operating frequency. Likewise, the tap 31 is at a low potential to ground. This makes the complete series-tuned circuit relatively insensitive to loads applied at the taps 30 and 31. Hence, instruments can be connected to the points 30 and 31 during operation for checking the average or D.C. potentials at the input electrodes 12*a* and 12*b* without loading the circuit.

It is found that with the circuit described, in which the tuning condenser 26 is effectively in series with the tube capacities 28 and 29, a relatively large tuning range is obtained.

It has been previously indicated that the input circuit may be energized by applying an input potential thereto at any point on the closed loop circuit. In the drawing, an input potential is applied from an input terminal 35 over a conductor 36 tapped into the inductance element 25. A good impedance match can be effected by tapping the conductor 36 into the element 25 at a point thereon suitably spaced from the tap 30. The proper location of the tap can be calculated, but it is usually easiest to determine it experimentally, moving the tap on the inductance 25 until the best operation is obtained.

For purpose of example, a circuit in accordance with the invention employing a Type 6360 dual tetrode tube having a capacity between its input grids of 5.1 M.M.F. and operable over the frequency range from 200 to 250 megacycles may have in its input circuit components of the following values:

| | |
|---|---|
| Condenser **26** | 1.8–5.1 M.M.F. |
| Condenser **24** | 1000 M.M.F. |
| Resistors **32, 33** | 27,000 ohms. |
| Resistor **23** | 150 ohms. |
| Inductance elements **25, 27.** | 8 turns #16 wire—5/16 in. inside diameter and 2 in. long. |

Although for the purpose of explaining the invention a particular embodiment thereof has been shown and described, obvious modifications will occur to a person skilled in the art, and we do not desire to be limited to the exact details shown and described.

We claim:

A high frequency tuned push-pull amplifier comprising: a pair of electronic amplifying devices, each having an input electrode, an output electrode, and a common electrode, and having inherent capacity between its input and common electrodes; means connecting said common electrodes together; an output circuit connected between said output electrodes; a tuned input circuit comprising a first inductance element, a tuning capacitor, and a second inductance element connected in the order named in series relation between said input electrodes; said inductance elements and capacitor having such values relative to said inherent capacities of said amplifying devices that the closed series circuit defined by said input circuit and said inherent capacities is resonant at the operating frequency means providing a bias potential between said common electrodes and said input electrodes comprising two direct current paths connected between said common electrodes and the null potential point on said respective inductance elements; and means for applying a high frequency input potential to be amplified between said common electrodes and a point on said input circuit.

References Cited in the file of this patent

UNITED STATES PATENTS

| | | |
|---|---|---|
| 2,299,481 | Johansson | Oct. 20, 1942 |
| 2,616,988 | Rodenhuis | Nov. 4, 1952 |

FOREIGN PATENTS

| | | |
|---|---|---|
| 748,295 | Germany | Nov. 1, 1944 |
| 69,853 | Denmark | Sept. 12, 1949 |
| 646,739 | Great Britain | Nov. 29, 1950 |